(12) United States Patent
Yamamoto et al.

(10) Patent No.: US 8,155,349 B2
(45) Date of Patent: Apr. 10, 2012

(54) MUTING CONTROL DEVICE, MUTING CONTROL METHOD, AND MUTING CONTROL PROGRAM

(75) Inventors: Tadashi Yamamoto, Neyagawa (JP); Dai Shimozawa, Neyagawa (JP)

(73) Assignee: Onkyo Corporation, Osaka (JP)

( * ) Notice: Subject to any disclaimer, the term of this patent is extended or adjusted under 35 U.S.C. 154(b) by 810 days.

(21) Appl. No.: 12/251,585

(22) Filed: Oct. 15, 2008

(65) Prior Publication Data

US 2009/0196437 A1 Aug. 6, 2009

(30) Foreign Application Priority Data

Feb. 5, 2008 (JP) .................................. 2008-25648

(51) Int. Cl.
*H03G 3/00* (2006.01)
(52) U.S. Cl. ........ 381/107; 381/104; 381/105; 381/106; 330/9
(58) Field of Classification Search .................. None
See application file for complete search history.

(56) References Cited

FOREIGN PATENT DOCUMENTS

| JP | 60-184311 | | 12/1985 |
|---|---|---|---|
| JP | 2-41508 | | 3/1990 |
| JP | 6-120752 | | 4/1994 |
| JP | 6-326537 | | 11/1994 |
| JP | 2001-203581 | | 7/2001 |
| JP | 2001-285984 | | 10/2001 |
| JP | 2005-303421 | * | 4/2005 |
| JP | 2009188668 A | * | 8/2009 |

* cited by examiner

*Primary Examiner* — Fernando L Toledo
*Assistant Examiner* — Mark A Laurenzi
(74) *Attorney, Agent, or Firm* — Renner, Otto, Boisselle & Sklar, LLP

(57) ABSTRACT

When controlling the audio signal to the mute mode from an unmute mode, first, the muting circuit switches from the non-attenuating state to the attenuating state to cause the muting circuit to attenuate the audio signal by the predetermined amount of attenuation, and then, the amount of attenuation by the volume control section is set to the maximum amount of attenuation to cause the volume control section to attenuate the audio signal by the maximum amount of attenuation.

2 Claims, 4 Drawing Sheets

MUTING CONTROL DEVICE, MUTING CONTROL METHOD, AND MUTING CONTROL PROGRAM

BACKGROUND OF THE INVENTION

1. Field of the Invention

The present invention relates to a muting control device capable of controlling an audio signal to be in a mute mode.

2. Description of the Related Art

In an audio equipment such as an amplifier device, a volume control device capable of controlling an input audio signal to be in a mute mode and attenuating an audio signal outputted to a subsequent amplifier circuit so that the volume level of the signal is set to zero. Examples of occasions to control the audio signal to be in the mute mode include an occasion where an instruction to control the signal to be in the mute mode is input through a user operation, where the amplifier device is switched to a power-on state from a stand-by state, and where a selector circuit that selects a single audio signal out of a plurality of input audio signals to output the selected signal to the amplifier circuit is switched (e.g., from a tuner to a CD player). The signal is muted when shifting to the power-on state or when switching the selector circuit in order to reduce the pop noise level, thereby suppressing a pop noise from being reproduced through a loud speaker.

As one method of controlling an audio signal to be in the mute mode, typically, a muting circuit is provided in a signal line of the audio signal. The muting circuit is constituted from resistors inserted in series in an audio signal line and a transistor inserted between the audio signal line and the ground potential. Turning on the transistor by a control signal from a microcomputer connects the audio signal line to the ground potential, thereby attenuating the level of the audio signal outputted to the subsequent amplifier circuit. The amount of attenuation of the audio signal when controlling the muting circuit to be in the mute mode is determined based on the resistance values of the inserted resistors, and in order to increase the attenuation amount of the audio signal so that the volume level of the signal is completely set to zero, the resistance values must be increased. Alternatively, a combined resistance must be increased by providing a number of muting circuits in series, each constituted from the resistors and the transistor. However, increasing the resistance value or providing a number of muting circuits in series also provides a large impedance component that is unnecessary for the audio signal in the audio signal line, and thus can cause deterioration in the sound quality of the audio signal in a normal reproduction mode which is in an unmute mode.

Japanese Unexamined Patent Publication No. 06-120752 discloses a volume control device capable of controlling an audio signal to be in the mute mode by controlling to set the volume level of an electronic volume to zero. However, due to the nature of the electronic volume, it is difficult to control to set the volume level to zero instantaneously when an instruction to set the volume level to zero is input from a microcomputer, and a certain length of time period is required before the volume level is set to zero. Accordingly, a pop noise can be disadvantageously outputted through a loud speaker before the volume level of an electronic volume is set to zero in a case where an audio signal is controlled to be in the mute mode when an amplifier device is turned on from a stand-by state or when a selector circuit is switched.

SUMMARY OF THE INVENTION

An object of the present invention is to provide a muting control device capable of instantaneously controlling an audio signal to be in a mute mode without increasing impedance of a muting circuit.

According to a preferred embodiment of the present invention, a muting control device for controlling an input audio signal to be in a mute mode comprises; volume control section capable of setting an amount of attenuation and controlling a volume level of the input audio signal; a muting circuit capable of switching between an attenuating state and a non-attenuating state, and, in the attenuating state, attenuating the audio signal by a predetermined amount of attenuation; and control section capable of, when controlling the audio signal to be in the mute mode, controlling to set the amount of attenuation by the volume control section to a maximum amount of attenuation, and controlling to cause the muting circuit to switch to the attenuating state, wherein when controlling the audio signal to the mute mode from an unmute mode, first, the muting circuit switches from the non-attenuating state to the attenuating state to cause the muting circuit to attenuate the audio signal by the predetermined amount of attenuation, and then, the amount of attenuation by the volume control section is set to the maximum amount of attenuation to cause the volume control section to attenuate the audio signal by the maximum amount of attenuation.

According to the present invention, because the volume control section attenuates the audio signal by the maximum amount of attenuation during a normal state of the mute mode, and the amount of attenuation by the muting circuit is applied to attenuate the audio signal only until the amount of attenuation by the volume control section finishes being set to the maximum amount of attenuation, the amount of attenuation by the muting circuit may be set to relatively small such that the pop noise is hardly heard to a listener. Accordingly, it is possible to set impedance of the muting circuit relatively small, and thereby preventing deterioration in the sound quality of the audio signal during normal reproduction when releasing the mute.

Further, although it takes more or less time before the volume control section is set to the maximum amount of attenuation, it is possible to first attenuate the audio signal by the predetermined amount of attenuation by the muting circuit as soon as an instruction by the control section to shift to the mute mode is supplied, because the muting circuit can instantaneously switch to the attenuating state. Thus, the muting circuit can attenuate the level of the pop noise that is generated when turning the power on or switching the selector.

Preferably, when controlling the audio signal to the unmute mode from the mute mode, first, the amount of attenuation by the volume control section is switched from the maximum amount of attenuation to the amount of attenuation that has been set before shifting to the mute mode to cause the muting circuit to attenuate the audio signal by the predetermined amount of attenuation, and then, the muting circuit switches to the non-attenuating state from the attenuating state to cause the muting circuit to unmute the audio signal.

When controlling the audio signal to the mute mode from the unmute mode, it is possible to decrease the amount of attenuation in a stepwise manner by shifting to the unmute mode after the muting circuit attenuates the audio signal by the predetermined amount of attenuation. Accordingly, although the pop noise can be generated if the audio signal is instantaneously unmuted, it is possible to prevent the pop noise from being generated by going through the mode attenuating the audio signal by the predetermined amount of attenuation by the muting circuit.

DETAILED DESCRIPTION OF THE PREFERRED EMBODIMENTS

Figure 1:
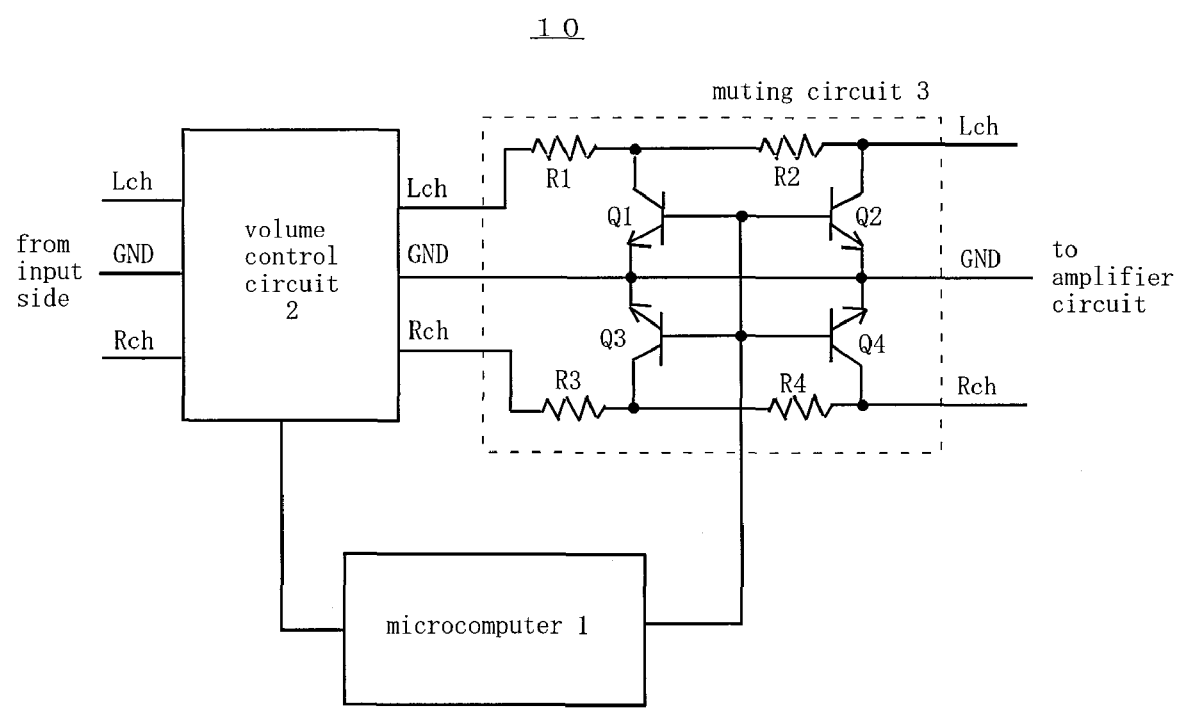
FIG. 1 is a schematic circuit diagram illustrating a volume control device according to a preferred embodiment of the present invention.

The following describes a muting control device 10 according to a preferred embodiment of the present invention. However, the present invention is not limited to the embodiment. FIG. 1 is a schematic circuit diagram illustrating the muting control device 10. The muting control device 10 is applied to a device such as an amplifier device, and includes a volume control circuit 2 and a muting circuit 3 that are provided between a circuit on a side from which audio signals are input and an amplifier circuit (not shown), and control section (e.g., a microcomputer) 1 that controls these devices.

The muting control device 10 has a mute mode and an unmute mode. In the mute mode, the volume level of the audio signal is attenuated by the volume control circuit 2 and/or the muting circuit 3, thereby setting the volume level of the audio signal either to completely zero, or as close as to zero. The mute mode includes a first mute mode in which only the muting circuit 3 works in the mute mode, and a second mute mode in which the volume control circuit 2 and the muting circuit 3 work in the mute mode. By going through the first mute mode in which only the muting circuit 3 works in the mute mode before shifting to the second mute mode in which the volume control circuit 2 also works in the mute mode, it is possible to prevent a pop noise from being reproduced through a loud speaker for sure. In the unmute mode, the volume control circuit 2 and the muting circuit 3 do not work in the mute mode, and the volume control circuit 2 controls the audio signal to the volume level set by a user operation.

The volume control circuit 2 can set an amount of attenuation in response to an instruction from the microcomputer 1, and to adjust the volume level of the audio signal by the amount of attenuation that has been set. The volume control circuit 2 is provided between the circuit on the side from which audio signals are input of the amplifier device (such as an LPF circuit, for example) and the muting circuit 3, and is typically constituted by a single chip electronic volume IC. The volume control circuit 2 controls the volume level of input audio signals (a left audio signal Lch and a right audio signal Rch) to output to the subsequent muting circuit 3.

When controlling the audio signal to the mute mode from the unmute mode, an instruction to set the amount of attenuation to the maximum amount of attenuation is supplied to the volume control circuit 2 from the microcomputer 1. The volume control circuit 2, in response to the instruction from the microcomputer 1, sets the amount of attenuation to the maximum amount, thereby working in the mute mode. That is, once the amount of attenuation is set to the maximum amount, as shown by a time period T3 in FIG. 2 and a time period T4 in FIG. 3 that are described later, it is possible to control the volume level of the audio signal to completely zero. In other words, the maximum amount of attenuation as used in the present invention refers to the amount of attenuation at which the volume level can be completely zero, in addition to the maximum amount of attenuation that the volume control circuit 2 can set.

By the nature of the volume control circuit 2 as compared to the muting circuit 3, the volume control circuit 2 cannot set the amount of attenuation to the maximum amount instantaneously in response to the instruction from the microcomputer 1, and requires more or less time before setting the amount of attenuation to the maximum amount. As a result, when instructions to shift to the mute mode are transmitted from the microcomputer 1 to the volume control circuit 2 and the muting circuit 3 substantially at the same time, the muting circuit 3 first shifts to the mute mode so as to be able to work in the mute mode, and then the volume control circuit 2 can set the amount of attenuation to the maximum amount after a predetermined period of time lapses.

The muting circuit 3 is, in response to the instruction from the microcomputer 1, switched between an attenuating state and a non-attenuating state. In the attenuating state, an audio signal outputted from the volume control circuit 2 is attenuated by a predetermined amount of attenuation, and the muting circuit 3 works in the mute mode. In the non-attenuating state, the audio signal outputted from the volume control circuit 2 is not attenuated by the predetermined amount of attenuation, and the muting circuit 3 does not work in the mute mode. The muting circuit 3 is provided between the volume control circuit 2 and the amplifier circuit, and includes resistors R1 to R4 and transistors Q1 to Q4, for example.

The resistors R1 and R2 are inserted in series with respect to a left audio signal line, and the transistors Q1 and Q2 are inserted in parallel with respect to the left audio signal line (between the left audio signal line and the ground potential). The resistors R3 and R4 are inserted in series with respect to a right audio signal line, and the transistors Q3 and Q4 are inserted in parallel with respect to the right audio signal line (between the right audio signal line and the ground potential).

To bases of the transistors Q1 to Q4, a control signal from the microcomputer 1 is provided. When the control signal is at a high level, the transistors Q1 to Q4 are turned on, the left audio signal line and the right audio signal line are connected to the ground potential via the resistors R1 to R4, and the audio signal is attenuated by the predetermined amount of attenuation. On the other hand, when the control signal are at a low level, the transistors Q1 to Q4 are turned off, the left audio signal line and the right audio signal line are disconnected from the ground potential, and the audio signal is not attenuated by the predetermined amount of attenuation.

The predetermined amount of attenuation by the muting circuit 3 can be set by the resistors R1 to R4. Resistance values of the resistors R1 to R4 are set relatively small compared to a conventional example (100 kΩ, for example). Therefore, impedance of the muting circuit 3 connected to the audio signal line can be smaller, and deterioration in the sound quality of the audio signal supplied to the amplifier circuit can be prevented in a normal reproduction mode which is in the unmute mode. Accordingly, because the amount of attenuation by the muting circuit 3 cannot be very large, it is not possible to set the value for the volume of the audio signal to completely zero even when the muting circuit 3 shifts to the attenuating state as shown by a time period T2 in FIG. 2 and a time period T5 in FIG. 3.

The muting circuit 3 can, in response to a control signal for the high level from the microcomputer 1, instantaneously shift from the non-attenuating state to the attenuating state. This is because the transistors Q1 to Q4 are instantaneously turned on in response to the control signal for the high level. Therefore, when the microcomputer 1 transmits the control signals to the volume control circuit 2 and the muting circuit 3 substantially at the same time, while it takes more or less time before the amount of attenuation by the volume control circuit 2 is set to the maximum amount, the muting circuit 3 can instantaneously shift to the attenuating state. Accordingly, by the muting circuit 3 instantaneously shifting to the attenuating state before the amount of attenuation by the volume control circuit 2 is set to the maximum amount, the attenuation by the muting circuit 3 contributes to reduction of the pop noise.

The microcomputer 1 reads and executes a program stored in a memory not shown in the figures, thereby controlling the operation of the amplifier device. For example, the microcomputer 1 controls the volume control circuit 2 and the muting circuit 3 to be either in the mute mode or in the unmute mode. When controlling the audio signal to the mute mode from the unmute mode, the microcomputer 1 controls the volume control circuit 2 to set the amount of attenuation to be the maximum amount. Further, the microcomputer 1 supplies the control signal for the high level to the muting circuit 3, thereby controlling the muting circuit 3 to be in the attenuating state (the state in which the transistors Q1 to Q4 are turned on). The microcomputer 1 controls the audio signal to the mute mode, when an instruction to shift to the mute mode is input through a user operation, when the amplifier device shifts to a power-on state from a stand-by state, or when switching a selector circuit between selectable states (tuner, CD player, and such).

Further, when controlling the audio signal to the unmute mode from the mute mode, the microcomputer 1 controls the volume control circuit 2 to again set the amount of attenuation to the amount of attenuation that has been set before shifting to the mute mode. Information of the amount of attenuation that has been set before shifting to the mute mode is stored in the memory within the microcomputer 1 that is not shown in the figures. Further, the microcomputer 1 supplies the control signal for the low level to the muting circuit 3, thereby controlling the muting circuit 3 to be in the non-attenuating state from the attenuating state (in which the transistors Q1 to Q4 are turned off). The microcomputer 1 controls the audio signal to the unmute mode, when an instruction to shift to the unmute mode is input through a user operation, after the amplifier device finishes shifting to a power-on state from a stand-by state, or after the amplifier device finishes switching the selector circuit between the selectable states (tuner, CD player, and such).

When shifting from the mute mode to the unmute mode, the microcomputer 1 first sets the amount of attenuation by the volume control circuit 2 to the amount of attenuation that has been set before shifting to the mute mode, and thus going through the first mute mode in which only the muting circuit 3 works in the mute mode. Then, after the predetermined period of time lapses, the microcomputer 1 controls the muting circuit 3 to shift to the non-attenuating state to be in the unmute mode. Accordingly, although the pop noise can be generated when instantaneously switching from the mute mode to the unmute mode, it is possible to prevent the pop noise from being generated because it is possible to decrease the amount of attenuation in a stepwise manner by first going through the first mute mode before shifting to the unmute mode.

Figure 2:
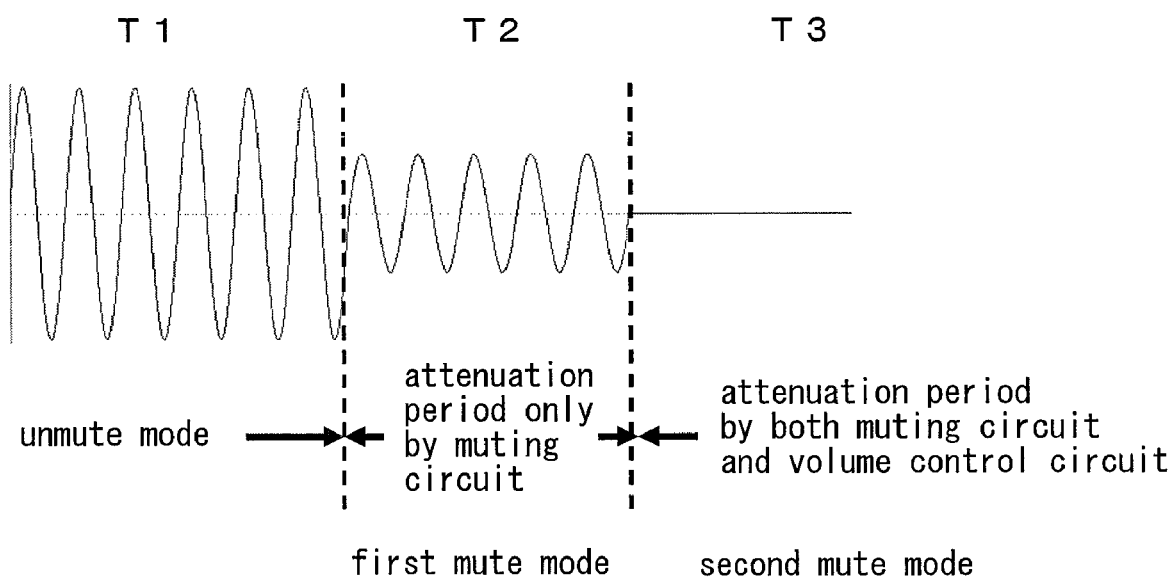
FIG. 2 is a timing chart illustrating a volume level of an audio signal when shifting from an unmute mode to a mute mode.
Figure 3:
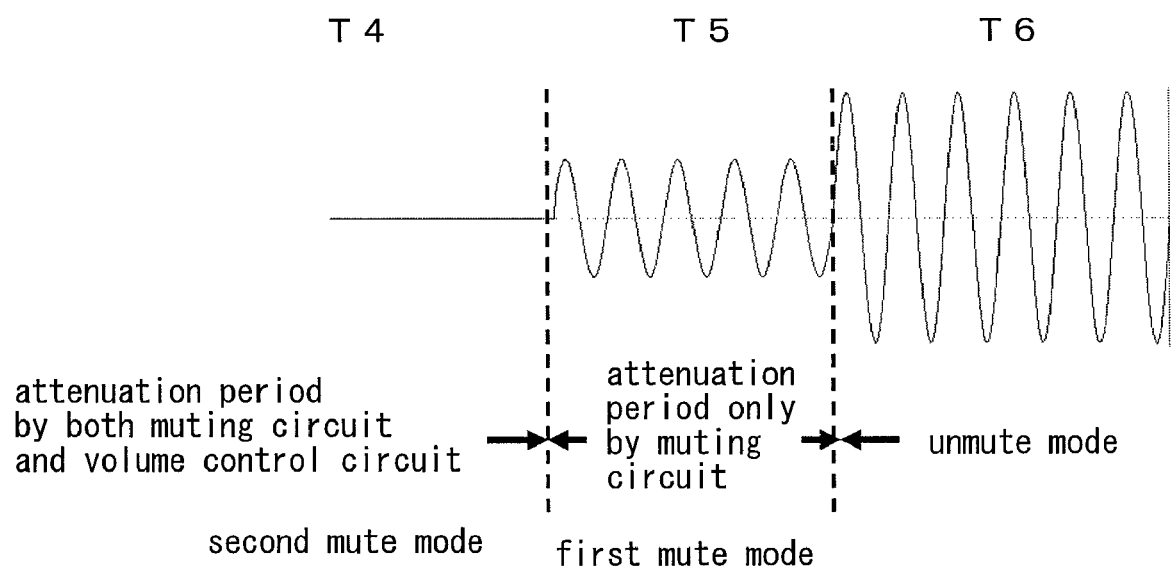
FIG. 3 is a timing chart illustrating a volume level of the audio signal when shifting from the mute mode to the unmute mode.
Figure 4:
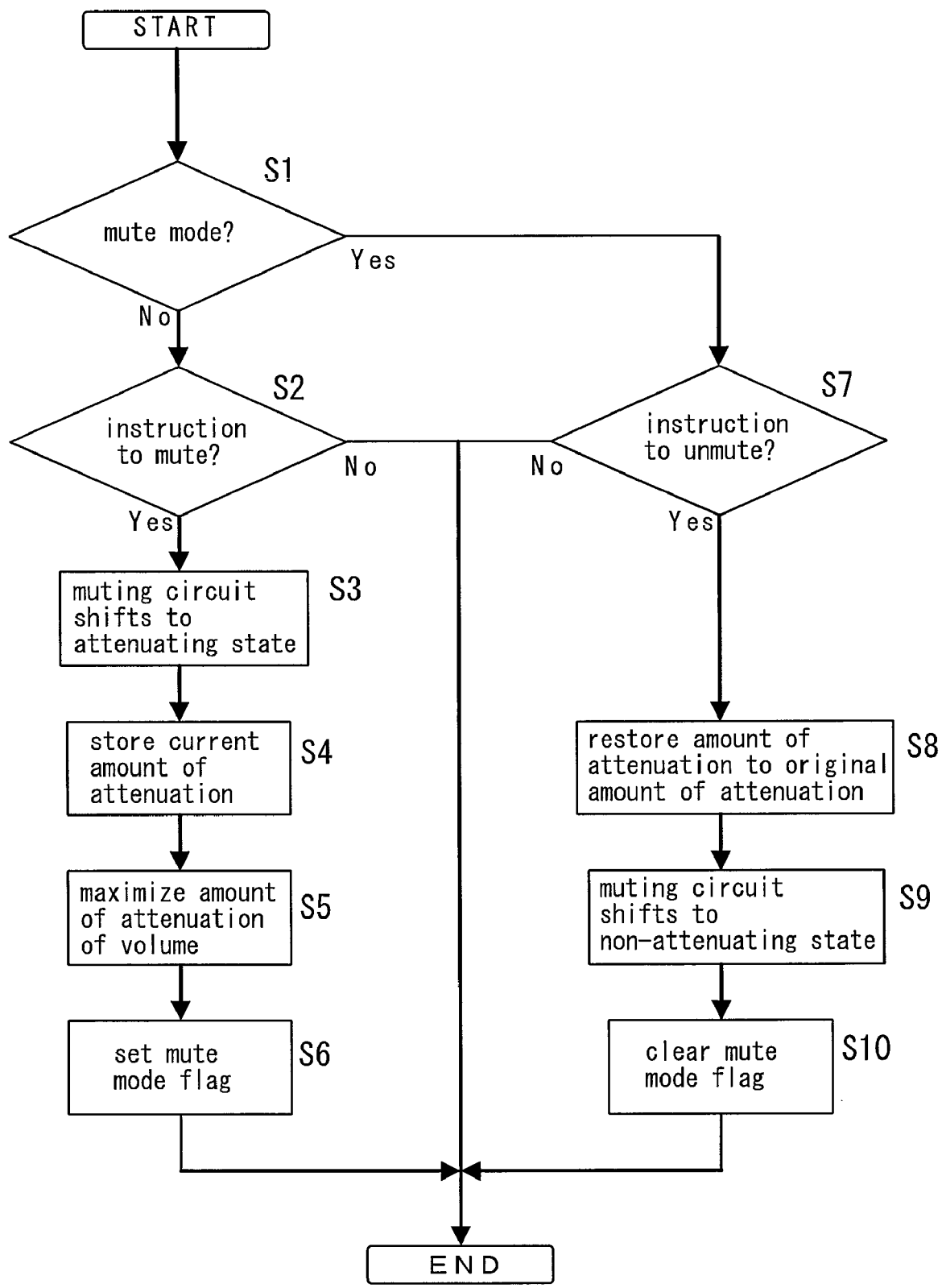
FIG. 4 is a flowchart illustrating a process by a microcomputer 1.

The following describes an operation of the muting control device 10 having the above configuration. FIG. 2 is a timing chart illustrating a volume level of the audio signal when shifting from the unmute mode to the mute mode. FIG. 3 is a timing chart illustrating a volume level of the audio signal when shifting from the mute mode to the unmute mode. FIG. 4 is a flowchart illustrating a process by the microcomputer 1.

First, referring to FIG. 2 and FIG. 4, a case when shifting from the unmute mode to the mute mode is described. In a time period T1 shown in FIG. 2, both the volume control circuit 2 and the muting circuit 3 are not in a state corresponding to the mute mode, and the audio signal is controlled and outputted at the volume level set through the user operation.

As shown in FIG. 4, the microcomputer 1 determines whether it is in the mute mode or not (S1). Whether it is in the mute mode or not can be determined by checking a mute mode flag that is set in S6 and S10. Here, it is in the unmute mode as shown in the time period T1 in FIG. 2 (NO in S1). The microcomputer 1 then determines whether or not an instruction to shift to the mute mode (for example, a mute instruction through a user operation, a power-on instruction, or a selector switching instruction) is input (S2).

If the instruction to shift to the mute mode is input (YES in S2), the microcomputer 1 controls the muting circuit 3 to be in the attenuating state (S3). That is, the microcomputer 1 supplies the high-level control signal to the bases of the transistors Q1 to Q4 of the muting circuit 3. When the high-level control signal is supplied to the bases, the transistors Q1 to Q4 are turned on, the left audio signal line and the right audio signal line are connected to the ground potential, thereby shifting from the non-attenuating state to the attenuating state. At this time, the amount of attenuation by the volume control circuit 2 is not yet set to the maximum amount, and the audio signal attenuated to the volume level set by the volume control circuit 2 with the user operation (see the volume level at T1) is attenuated by the predetermined amount of attenuation set by the muting circuit 3 as shown at the time period T2 and outputted (set to the first mute mode).

When the high-level control signal is supplied to the muting circuit 3, the transistors Q1 to Q4 are instantaneously turned on, and the muting circuit 3 can shift to the attenuating state. Therefore, it is possible to shift to the attenuating state (first mute mode) as in the time period T2 substantially at the same time as the microcomputer 1 outputs the high-level control signal. Thus, it is possible to attenuate the level of the pop noise that is generated when turning the power on or switching the selector, such that the volume level of the pop noise reproduced through the loud speaker may not be discomfort for listeners.

Next, the microcomputer 1 stores the amount of attenuation currently set for the volume control circuit 2 in the memory that is not shown in the figure (S4). This is because, when shifting to the unmute mode, the amount of attenuation by the volume control circuit 2 may be again set to the amount of attenuation that has been set through the user operation before shifting to the mute mode.

Then, the microcomputer 1 transmits an instruction to the volume control circuit 2 to set the amount of attenuation to the maximum amount (S5). The volume control circuit 2, upon reception of the instruction from the microcomputer 1, sets the amount of attenuation to the maximum amount. As a result, as shown by the time period T3, the audio signal is attenuated by the maximum amount of attenuation by the volume control circuit 2 (second mute mode), and controlled so that the volume level is completely zero. While it takes more or less time before the volume control circuit 2 finishes setting the amount of attenuation to the maximum amount in response to the instruction from the microcomputer 1, the volume level of the audio signal is attenuated by the predetermined amount of attenuation already in the time period T2 by the muting circuit 3 as described above, and therefore it is possible to prevent the user from feeling uncomfortable.

Then, the microcomputer 1 sets the mute mode flag in the memory that is not shown, thereby managing the state in the mute mode (S6).

Referring to FIGS. 3 and 4, a case when shifting from the mute mode to the unmute mode is described below. The time period T4 in FIG. 3 corresponds to the second mute mode. The amount of attenuation by the volume control circuit 2 is set to the maximum amount, and the muting circuit 3 is controlled to be in the attenuating state. Accordingly, the audio signal is attenuated by the maximum amount of attenuation by the volume control circuit 2, and the volume level of the audio signal is completely zero.

When it is determined to be in the mute mode in S1 (YES in S1), the microcomputer 1 determines whether or not an instruction to unmute is input (S7). If the instruction to unmute is input (YES in S7), the microcomputer 1 controls such that the amount of attenuation by the volume control circuit 2 is set to the amount of attenuation that has been set before shifting to the mute mode from the maximum amount of attenuation (S8). That is, in S4, the microcomputer 1 reads the amount of attenuation stored in the memory and transmits this amount of attenuation to the volume control circuit 2. The volume control circuit 2 obtains information of the amount of attenuation from the microcomputer 1, and again sets the amount of attenuation to the amount of attenuation that has been obtained from the microcomputer 1 and that has been set before shifting to the mute mode from the maximum amount of attenuation (that is, the volume control circuit 2 does not work in the mute mode). At this time, because the muting circuit 3 is not yet supplied with the low-level control signal, the muting circuit 3 is still in the attenuating state (works in the mute mode), the audio signal adjusted to the volume level set by the volume control circuit 2 through the user operation (see the volume level at T6) is attenuated by the predetermined amount of attenuation set by the muting circuit 3 as shown in the time period T5 and outputted (that is, shift to the first mute mode).

Then, when a predetermined time period has lapsed since the amount of attenuation by the volume control circuit 2 is set to the amount of attenuation before shifting to the mute mode (time period T5), the microcomputer 1 controls the muting circuit 3 to shift from the attenuating state to the non-attenuating state (S9). That is, the microcomputer 1 supplies the low-level control signal to the bases of the transistors Q1 to Q4 of the muting circuit 3. When the low-level control signal is supplied to the bases of the transistors Q1 to Q4, the transistors Q1 to Q4 are turned off, and the left audio signal line and the right audio signal line are disconnected from the ground potential, thereby shifting from the attenuating state to the non-attenuating state. As described above, because the amount of attenuation by the volume control circuit 2 is restored to the amount of attenuation before shifting to the mute mode, it is determined to be in the unmute mode as shown in the time period T6, and the audio signal is adjusted to the volume level that is set by the volume control circuit 2 through the user operation and outputted.

As described above, according to the present invention, while it takes more or less time before the volume control circuit 2 is set to the maximum amount of attenuation, the muting circuit 3 shifts to the first mute mode in which the audio signal can be attenuated by the predetermined amount of attenuation by the muting circuit 3, because the muting circuit 3 can instantaneously shift to the attenuating state as soon as the instruction to shift to the mute mode is outputted from the microcomputer 1. Thus, the muting circuit 3 can attenuate the level of the pop noise that is generated when turning the power on or switching the selector. Further, because the amount of attenuation increases in a stepwise manner by shifting from the unmute mode to the second mute mode via the first mute mode, it is possible to prevent the pop noise from being generated when shifting to the mute mode.

While the preferred embodiment of the present invention has been described, the present invention is not limited to this embodiment. The present invention can be provided as a computer program that causes a computer to execute the above-described processing of the muting control device as well as a recording medium that stores such a program.

What is claimed is:

1. A muting control device for controlling an input audio signal to be in a mute mode, the device comprising:
   volume control section capable of setting an amount of attenuation and controlling a volume level of the input audio signal;
   a muting circuit capable of switching between an attenuating state and a non-attenuating state, and, in the attenuating state, attenuating the audio signal by a predetermined amount of attenuation which is less than a maximum amount of attenuation; and
   control section capable of, when controlling the audio signal to be in the mute mode, controlling to set the amount of attenuation by the volume control section to the maximum amount of attenuation, and controlling to cause the muting circuit to switch to the attenuating state, wherein
   when controlling the audio signal to the mute mode from an unmute mode, first, the muting circuit switches from the non-attenuating state to the attenuating state to cause the muting circuit to attenuate the audio signal by the predetermined amount of attenuation, and then, the amount of attenuation by the volume control section is set to the maximum amount of attenuation to cause the volume control section to attenuate the audio signal by the maximum amount of attenuation.

2. The muting control device according to claim 1, wherein when controlling the audio signal to the unmute mode from the mute mode, first, the amount of attenuation by the volume control section is switched from the maximum amount of attenuation to the amount of attenuation that has been set before shifting to the mute mode to cause the muting circuit to attenuate the audio signal by the predetermined amount of attenuation, and then, the muting circuit switches to the non-attenuating state from the attenuating state to cause the muting circuit to unmute the audio signal.

* * * * *